US007596402B2

(12) United States Patent
Duerk et al.

(10) Patent No.: US 7,596,402 B2
(45) Date of Patent: Sep. 29, 2009

(54) MRI PROBE DESIGNS FOR MINIMALLY INVASIVE INTRAVASCULAR TRACKING AND IMAGING APPLICATIONS

(75) Inventors: Jeffrey L. Duerk, Avon Lake, OH (US); Daniel Elgort, Cleveland Heights, OH (US); Chris Flask, Avon Lake, OH (US); Claudia M. Hillenbrand, Cleveland Heights, OH (US); Jonathan S. Lewin, Baltimore, MD (US); Eddy Y. Wong, Cleveland Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 668 days.

(21) Appl. No.: 10/839,922

(22) Filed: May 5, 2004

(65) Prior Publication Data

US 2005/0054914 A1 Mar. 10, 2005

Related U.S. Application Data

(60) Provisional application No. 60/468,172, filed on May 5, 2003, provisional application No. 60/468,173, filed on May 5, 2003.

(51) Int. Cl.
*A61B 5/055* (2006.01)
(52) U.S. Cl. .................. 600/423; 600/410; 600/420; 600/422; 324/307; 324/309
(58) Field of Classification Search ................ 600/423, 600/407, 410, 420, 424, 431, 433, 435; 324/318, 324/322, 307, 309
See application file for complete search history.

(56) References Cited

U.S. PATENT DOCUMENTS 5,211,166 A * 5/1993 Sepponen ............... 600/420

| 5,715,822 A | | 2/1998 | Watkins et al. |
| 5,735,795 A | * | 4/1998 | Young et al. ............. 600/410 |
| 6,361,759 B1 | * | 3/2002 | Frayne et al. ............ 424/9.323 |
| 6,574,497 B1 | * | 6/2003 | Pacetti ..................... 600/420 |
| 6,949,266 B2 | * | 9/2005 | Schachter et al. ......... 427/2.24 |

(Continued)

FOREIGN PATENT DOCUMENTS

WO       WO 00/72032       * 11/2000

(Continued)

OTHER PUBLICATIONS

Bartels, L.W., Bakker, C.J.G., Bos, C., van der Weide, R., Viergever, M.A., "MR Guidance of Vascular Interventions," Jun. 2001, Proceedings of the International Workshop on Medical Imaging and Augmented Reality, pp. 39-43.*

(Continued)

*Primary Examiner*—Brian Casler
*Assistant Examiner*—Peter Luong

(57) ABSTRACT

A probe suitable for attachment to, or incorporation in, a medical interventional device, such as a catheter, and which may be employed for tracking, imaging, or both, includes a first material having an MR resonance frequency distinct from a resonance frequency of a second material adjacent to the first material. The probe may include one or more coils, or it may be wireless, that is, it may have no coils. Some probe configurations are directed at tracking or imaging of vascular vessels or tissue, and configurations allow both tracking and imaging.

1 Claim, 18 Drawing Sheets

U.S. PATENT DOCUMENTS

2003/0065267 A1    4/2003    Smith

FOREIGN PATENT DOCUMENTS

WO         01/75465 A1    10/2001

OTHER PUBLICATIONS

Coil—Definitions from Dictionary.com. Jul. 2008.*
Array—Definitions from Dictionary.com. Jul. 2008.*
Anatomic—Definitions from Dictionary.com. Jul. 2008.*
Wire—Definitions from Dictionary.com. Jul. 2008.*
International Search Report and Written Opinion for International Application No. PCT/US2004/014128.

* cited by examiner

Seg. EPI

TR/TE: 1000/26 ms
TA: 2:20 min
Slices: 7
SL: 2 mm
FOV: 39*53 mm²
Matrix: 94*128

True FISP

TR/TE: 17.2/8.6 ms
TA: 3.85 sec/slice
Slices: 3
SL: 2 mm
FOV: 50*58 mm²
Matrix: 224*512

HASTE

TR/TE: 4000/93 ms
TA: 4:13 min
Slices: 7
SL: 3 mm
FOV: 40*54 mm²
Matrix: 192*256

Spin Echo

TR/TE: 1800/77 ms
TA: 28:46 min
Slices: 12
SL: 2 mm
FOV: 10*14mm²
Matrix: 192*256

MRI PROBE DESIGNS FOR MINIMALLY INVASIVE INTRAVASCULAR TRACKING AND IMAGING APPLICATIONS

CROSS-REFERENCE TO RELATED APPLICATIONS

This application incorporates by reference in entirety, and claims priority to and benefit of, U.S. Provisional Patent Application No. 60/468,172, filed on 5 May 2003. This application also incorporates by reference in entirety, the contents of simultaneously-filed U.S. utility application titled "Adaptive Tracking and MRI-Guided Catheter and Stent Placement," by J. L. Duerk et al., which claims priority to U.S. Provisional application 60/468,173 filed on 5 May 2003. This application also incorporates by reference in entirety, and claims priority to and benefit of, U.S. Provisional Patent Application No. 60/468,173 filed on 5 May 2003.

GOVERNMENT SUPPORT

This invention was made with government support under Contract Number R01CA81431-02; and R33CA14401, both awarded by the NCI. The Government has certain rights in the invention.

BACKGROUND

A goal of endovascular MRI-guided interventions is the combination of MRI's diagnostic capabilities (e.g., angiography, morphology, plaque analysis, perfusion imaging and others) with therapeutic interventions such as angioplasty, catherectomy and stent placement. A successful MRI-guided endovascular therapeutic procedure incorporates a subset of the following steps: MR guidance of the interventional device to the target region, high-resolution imaging at the target location in order to diagnose disease within the vessel wall, performance of a therapeutic intervention, and evaluation of the efficacy of therapy. The requirements for successful guidance and high-resolution imaging are generally quite different. To date, intravascular MRI devices have been designed primarily for either active and passive tracking or for high-resolution intravascular imaging. Minimally invasive image-guided therapy requires a quick and robust method for device localization, as well as the ability for tracking and guidance of interventional devices inserted into the body.

SUMMARY OF THE INVENTION

There is a continuing need for an improved dedicated tracking device, in particular in conjunction with active tracking, and of a dedicated imaging device. There also is a need for a high-performance device suitable for both tracking and imaging, and for an improved tracking device that reduces or eliminates tissue damage caused by local heating of wired probes. Accordingly, the MRI tracking and imaging systems described herein are directed at addressing these needs. The systems and methods of the invention are directed, in at least one aspect, at diagnostic and therapeutic MRI imaging applications. More particularly, the systems and methods disclosed herein are directed at designs of coils and wireless probes that can be used for tracking and imaging applications.

According to one aspect of the invention, an MR imaging coil for intravascular imaging includes a coil assembly comprising coaxially arranged first and second coils, wherein the first coil is wound in a first direction and the second coil is at a distance from the first coil and wound in a direction opposite of the first direction. In one configuration, the connecting wires connecting the first coil with the second coil are disposed either longitudinally near or at the center between the first and second coils, or substantially collinearly longitudinally along an imaginary line connecting a periphery of the first and second coils. These coil arrangements provide high image quality with a low number of artifacts introduced by the connection wires.

In an alternate embodiment, each coil can be connected to a separate receive channel that can be accessed independently during an MR imaging experiment. According to one practice, each coil can be individually frequency-tuned, and the signals received from each coil can be processed separately and used to localize the imaging coil and/or to image the vessel walls.

According to another aspect of the invention, a wireless (or coil-less) MRI tracking probe includes a lumen containing a first material having a magnetic resonance (MR) frequency distinct from a resonance frequency of a second material adjacent to the lumen. The first material may include a liquid, such as acetic acid and a contrast material which may include, for example, a rare-earth compound, such as gadolinium. The second material can include anatomic tissue, producing, for example, a fat signal, a water signal, or a combination thereof.

The probe described above can be incorporated in a catheter. The probe and/or the catheter can be tracked by applying a conventional FLASH (Fast Low Angle SHot) sequence to excite the magnetic resonance (MR) frequency for obtaining an anatomic image of the second material, and by applying a CHESS (Chemical shift selective excitation) pulse to excite the MR resonance frequency of the first material for obtaining a catheter-selective image. A suitable image of the probe in the anatomic tissue can be obtained by comparing the anatomic image and the catheter-selective image. Repeating the FLASH and CHESS-based image acquisition at substantially discrete temporal instances produces a sequence of catheter-selective and anatomic images that facilitate tracking of the catheter over a length of time.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

The invention generally is directed at systems and methods for MRI tracking and imaging applications. In particular, the systems and methods described herein can be both actively and passively tracked and may also be suitable for providing high-resolution images.

Various implementations of tracking applications will now be described. Several different catheter designs with tracking coils and/or antennas are considered: each varies by the number and arrangement of active loop elements and whether or not an internal signal source is incorporated into the device. A coil-less tracking device is also disclosed.

Figure 1:
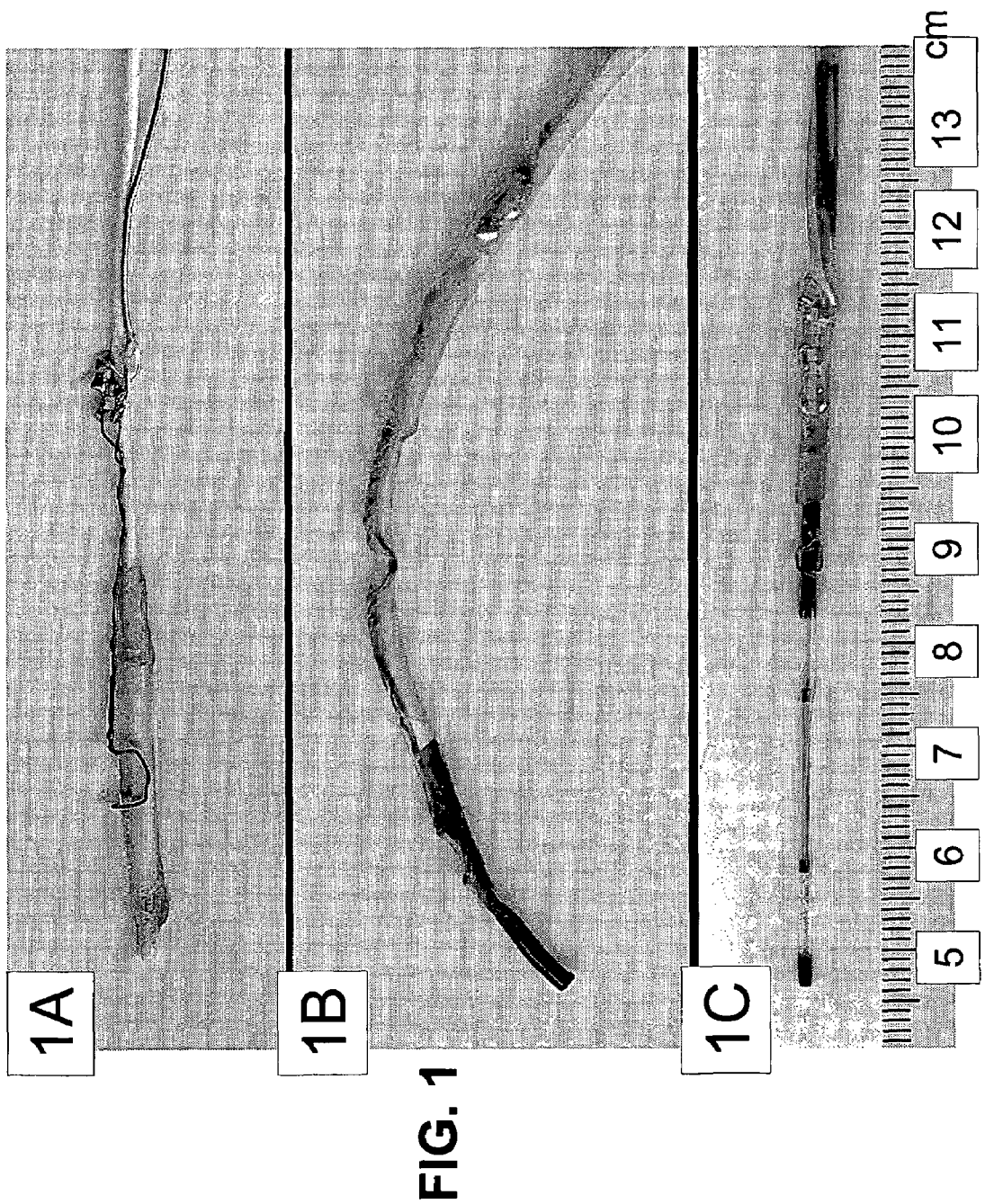
FIG. 1 shows a single-element (A) and double-element (B) tracking antenna with and without internal signal source and (C) a single-element tracking antenna mounted on a balloon catheter.

Referring to FIG. 1, a single-element (A) and double-element (B) tracking antenna with and without internal signal source and (C) a single-element tracking antenna was mounted on a balloon catheter. In one embodiment, active loop elements are wound from a copper magnet wire of about 30 AWG. Dimensions of the loop elements are approximately 4 mm along the long axis and 2.5 mm along the short axis. The loops of the double-loop tracking coils were wound with a center-to-center distance of about 23 mm. Tuning and matching of the resonant circuit was accomplished using surface mount capacitors. Capacitive coupling to the MR receiver system was made utilizing a micro-coaxial cable. A plastic tube was then affixed over the active antenna elements and secured into place with epoxy. The tube was then filled with an internal signal source and sealed. Devices utilizing a signal source have a maximum dimension of about 11 F in diameter while those that do not have a signal source have a maximum diameter of about 8F. A single-element device is shown in FIG. 1A and a two-element device in FIG. 1B. A single-element tracking antenna with no signal source was also mounted on a balloon catheter. This device is shown in FIG. 1C.

The use of a loop coil design provides for sensitivity in most orientations during typical device use. An internal signal source provides several advantages in active tracking experiments. The signal source allows for tracking to be performed with very low flip angles (approx. 1°-2°). Tip angle amplification results in the signal source seeing an effective tip angle greater than the rest of the surrounding tissue, making identification from the surrounding tissue easier. The use of a low tip angle also eliminates the need for dephaser gradients to eliminate tissue signal during tracking, allowing for increased temporal resolution in tracking experiments.

Figure 2:
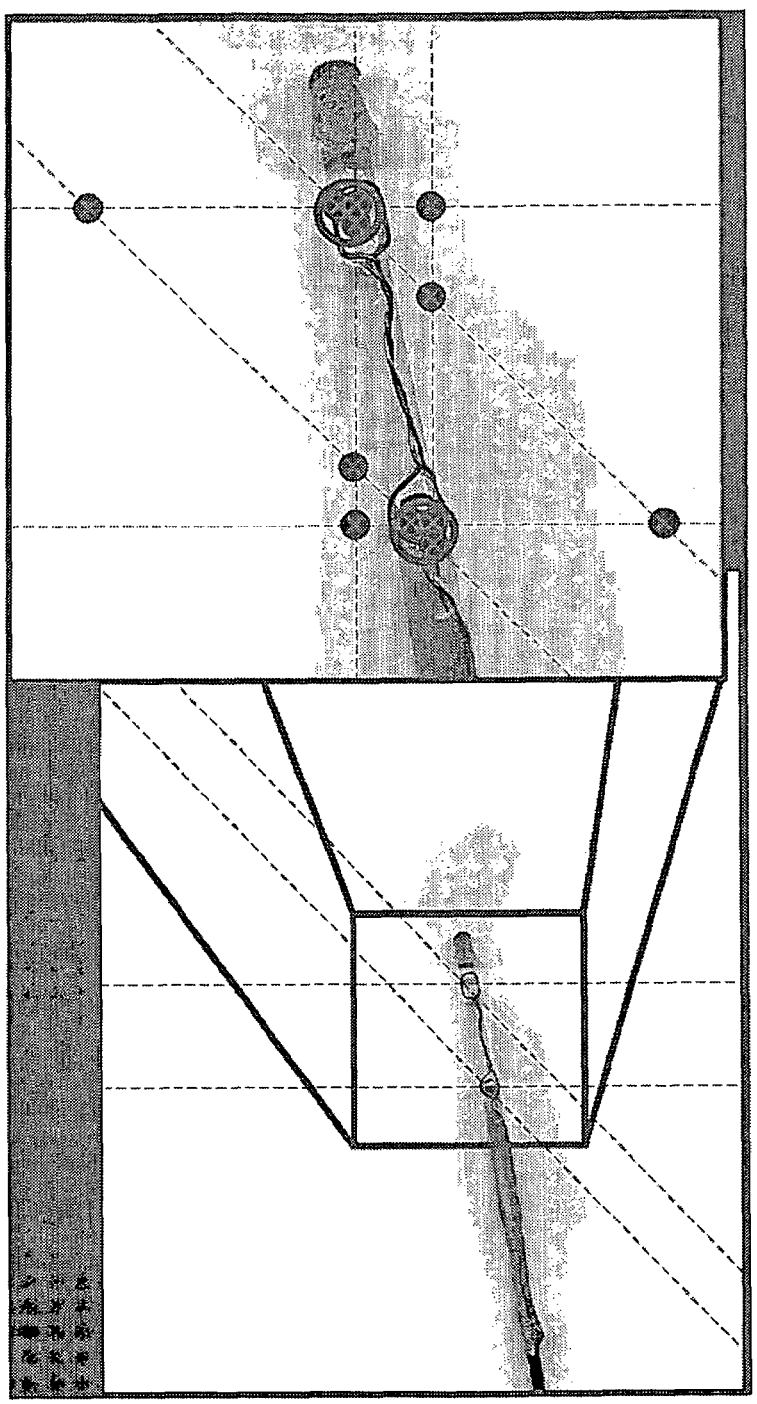
FIG. 2 depicts a bi-plane radial localization algorithm.

Phantom and in vivo porcine tracking experiments were conducted using a Siemens 1.5T Sonata clinical scanner. Tracking experiments examined the reliability and robustness of each antenna design for detection and tracking. Evaluation criteria included the ability to reliably follow catheter insertion and retraction in both a vessel phantom and in an animal model (e.g., anatomic vessel, tissue, etc.). Accuracy measurements were also performed to evaluate the ability to properly position the scan plane. Software implementing a subset of the aspects of the systems and methods described herein was employed to cause the scanner to automatically track the catheter in real-time using a limited number of projections. The system also allows an imaging slice location and orientation to follow the catheter by alternating between localization and imaging modes. For use with the single-element catheter, the software collects three projections (orthogonal or non-orthogonal) and updates the scan plane position. For use with the double-element catheter, the tracking software implements a bi-plane radial localization algorithm and updates the scan plane position and orientation. This process is depicted pictorially in FIG. 2. The tracking software is combined with several fast imaging sequences to collect image data between localizations. The tracking experiments performed using the systems and methods described herein may utilize both fast, low long-angle (FLASH) sequences and steady-state (True-FISP) sequences.

Catheter advancement and retraction were tracked in all imaging experiments. The contrast-to-noise ratio (CNR) of the internal signal source was approximately 10 during the tracking phase of the experiments; the system accuracy was better than 3 mm in displacement error and 2° orientation error.

The use of a loop antenna design is advantageous for several reasons. In catheter-based interventions on a horizontal B0 field MR system, the loop antenna design provides the greatest B1 sensitivity as compared with other designs such as the solenoid. Additionally, the loop design conforms well to the shape of the catheter with minimal increase in dimensions; moreover, a sheath for the internal signal source can be easily applied over the antenna. An internal signal source can provide several advantages in active tracking experiments. When used for tracking applications inside blood vessels, however, the internal source does not offer a distinct advantage as the blood itself serves as a signal source close to the antenna elements. However, in interventions that occur in locations where there may be a lack of excitable spins near the antenna element, such as in the digestive tract or lung, an internal signal source is advantageous.

As mentioned above, in various embodiments, configurations with single- and double-active loop elements are used. The advantage of a single-loop design is that the localization system is more robust, generally not having to extract more than one signal peak from the tracking data. With respect to speed, tracking can be performed faster on a single loop system than tracking with a two-antenna system. However, there exists a distinct advantage in having a two-loop design, as a two-loop device allows the tracking system to provide both device orientation and device position.

Figure 3:
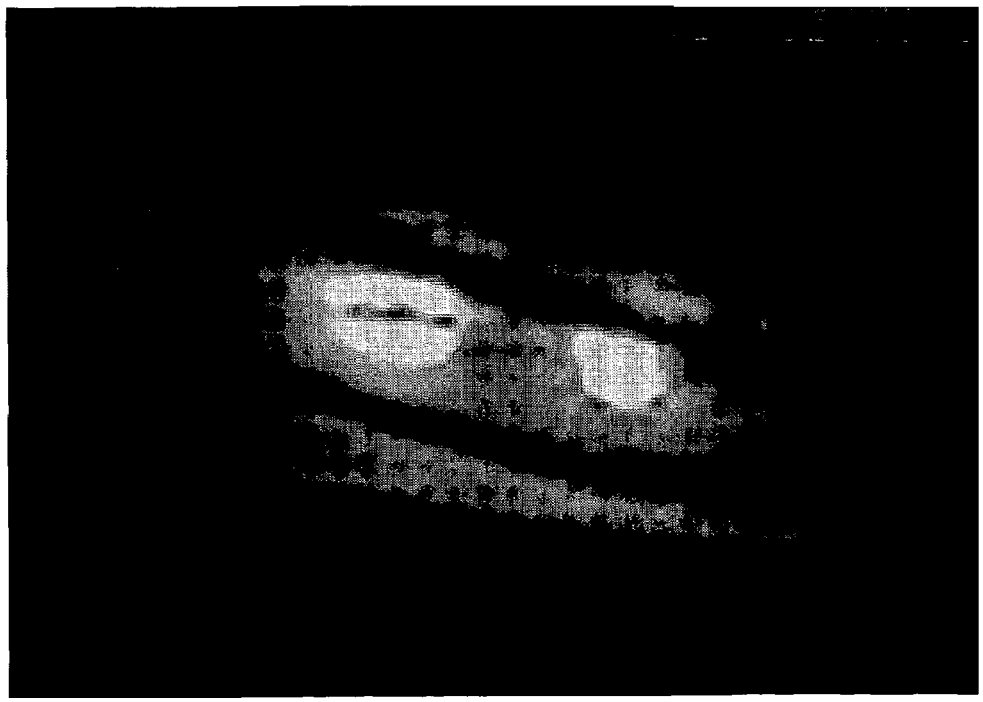
FIG. 3 depicts vessel phantom imaging with a two-element tracking antenna having an internal signal source.
Figure 4:
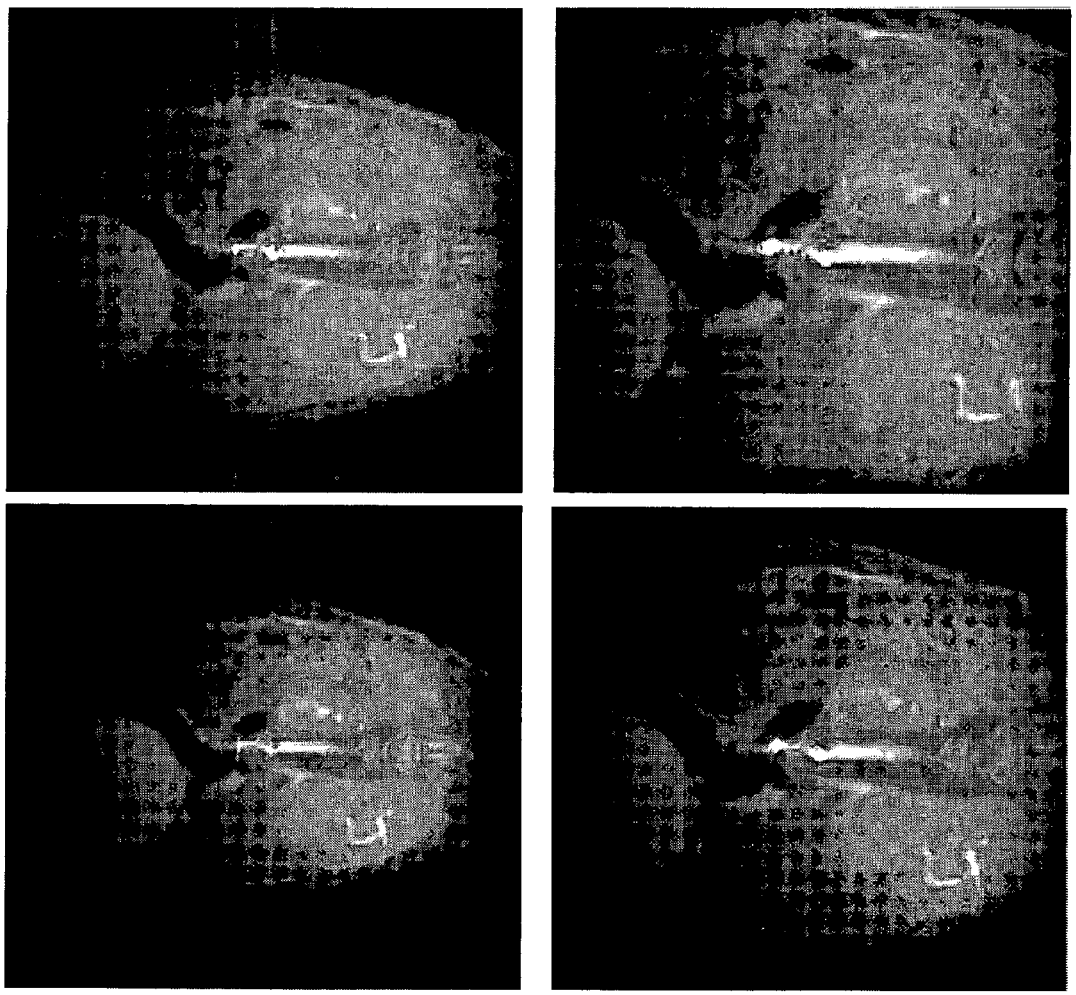
FIG. 4 shows a temporal sequence of in vivo porcine imaging experiments with a two-element tracking antenna without a signal source.

FIG. 3 depicts vessel phantom imaging with a two-element tracking antenna having an internal signal source. FIG. 4 shows a temporal sequence of in vivo porcine imaging experiments performed with a two-element tracking antenna without a signal source.

Whereas the aforedescribed coil design is well-suited for tracking, a coil design with good radial homogeneity is advantageous for applications aimed at characterization of the vessel wall or locating vulnerable plaque. Due to the complexity and the generally lengthy process required for construction of a catheter-based imaging coil, simulations are performed to determine the coil parameters that provide the optimal SNR and field homogeneity.

A common way to quantitatively characterize the magnetic field produced by a distribution of steady-state currents is by employing the Biot-Savart law, a derivation from Maxwell's equations. For a segment of wire of length dl carrying a current I, the Biot-Savart law states that the magnetic field dB produced by that wire segment at a distance r from the segment is given by the following equation:

$$dB = \frac{\mu_0 I}{4\pi} \frac{dl \sin\theta}{r^2}$$

Solving this for an arbitrary configuration of current elements, such as with a coil, the magnetic field vector at any point in space can be calculated. To calculate B, the equation can be integrated as follows:

$$B = \frac{\mu_0 I}{4\pi} \oint \frac{dl \sin\theta}{r^2}$$

For a wire element, carrying current I, the integration leads to the following formula for B:

$$B = \frac{\mu_0 I}{4\pi r}$$

where r is the radial distance from the wire element at which B is to be calculated.

From these equations, it is possible to calculate the magnetic field for a given configuration of wires.

Figure 5:
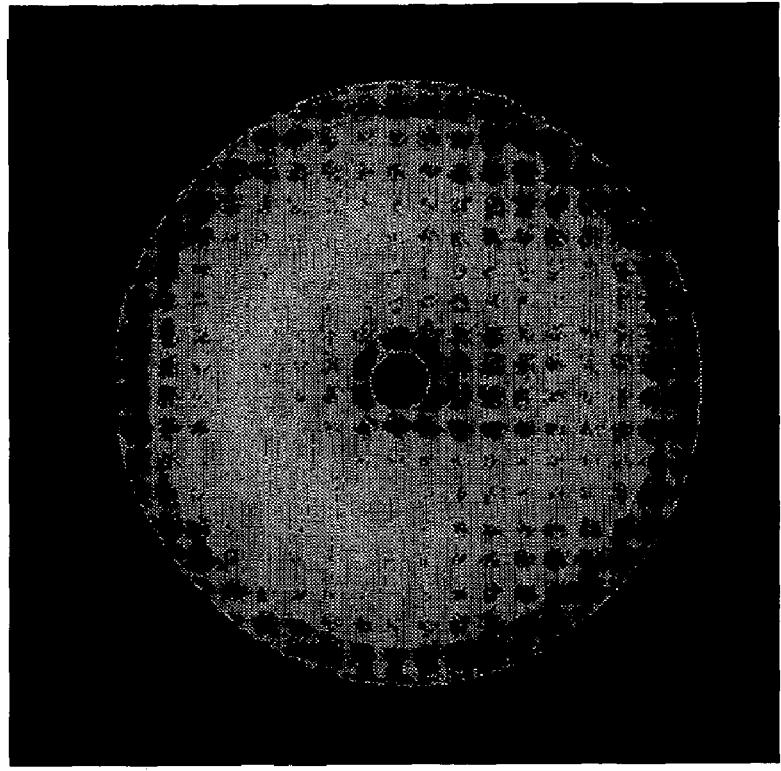
FIG. 5 shows an approximation of a solenoid using a single square and octagon winding.
Figure 5:
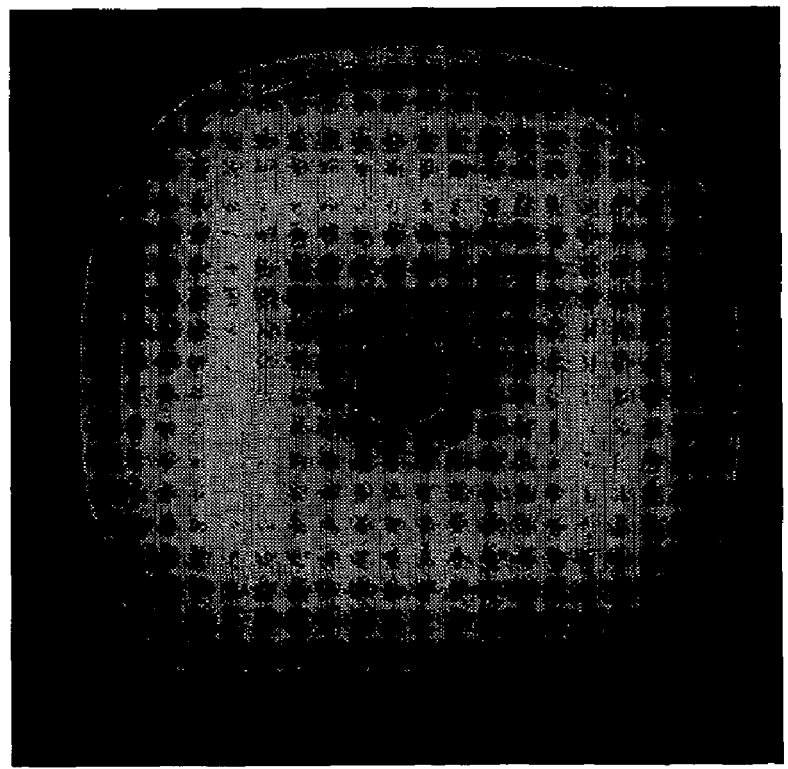

Biot-Savart simulations were performed using MATLAB (The Mathworks, Natick, Mass.). B-field components were calculated for prescribed imaging planes with respect to the location of the coil. Separate files were created for each opposed solenoid coil configuration to be examined. Solenoid coils were approximated using octagons. This was done as a compromise between an accurate approximation of a solenoid and the ease by which the variations in each parameter to be optimized could be incorporated. Octagons were deemed sufficient for representing a solenoid through inspection of a field plot generated with both octagon and square winding, as shown in FIG. 5. Field lines were obtained for a distance from the windings equivalent to the location of the enhancement region of an opposed solenoid coil. A circle was inscribed in the field plots and distortions were noted.

Two areas of coil design and their effect on SNR and field homogeneity were examined. The placement of the electrical wires to connect the two opposed solenoids and their effect on the field homogeneity was first investigated. Here, five different configurations for wire location were examined. The first two configurations involved placing the wires on opposite sides of the interventional device. In the first configuration, an additional half turn was added to one of the solenoids so that the connecting wires would be located on opposite sides of the interventional device, while in the second configuration, the additional half-turn is eliminated by feeding the wire straight through the interventional device. The third configuration involved running the wires along the inside wall of the interventional device. The fourth configuration involved running the wires inside the device but substantially along the center instead of the inside walls and the fifth configuration involved running the wires along the same side of the device. For reference, a simulation was generated for an opposed solenoid coil with no connecting wires.

The second area of simulations examined different solenoid construction parameters for their effect on the B-field in the imaging region of an opposed solenoid coil. Four parameters were examined; the number of windings in each solenoid, diameter of the solenoid, the pitch of the solenoid windings and the separation distance between the opposed solenoid coils. The number of windings was varied between one and nine, the diameter of the solenoid was varied between about 3F and about 18F, the pitch of the solenoid windings was varied between about zero and about 2.5 times the wire thickness and the separation distance was varied between about zero and about five times the diameter using a solenoid with a diameter of about 5F.

The Biot-Savart simulation results obtained for the opposed solenoid coil should follow closely those trends prescribed by the two equations defining the B-field of a conventional solenoid. Inside a solenoid, the equation for calculating the transverse magnetization, $B_{xy}$, is given as:

$$B_{xy} = \frac{\mu_o N I}{L}$$

From this equation, a direct relationship between the number of turns (N) and $B_{xy}$ is observed while an inverse relationship between the pitch of the windings, which relates to overall length (L), and $B_{xy}$ is also observed. For calculating the field outside of the solenoid, which examines the radial "reach" of an imaging coil, the following equation applies:

$$B_{xy}(z) = \frac{\mu_o I R^2}{2 z^3}$$

From this equation, a direct relationship between the diameter of the coil and $B_{xy}$ at a given distance away from the coil can be observed. Simulation results obtained follow the relationships as described by the equations.

Figure 6:
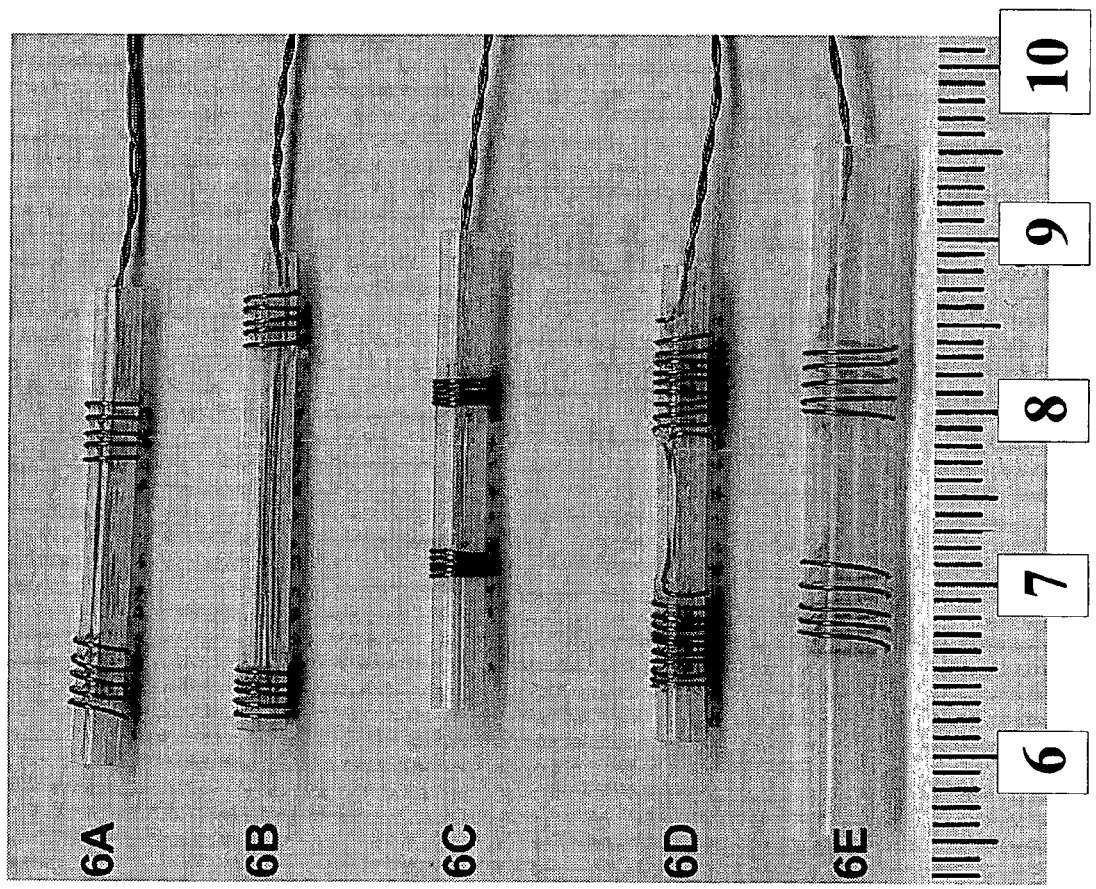
FIG. 6 (A-E) show five different embodiments of opposed-solenoid imaging coils.

Five opposed solenoid coils, each with different variants in the four simulation parameters, were constructed for validation of the simulation results. The five coils constructed included one with an optimized coil design (FIG. 6A), one with a large separation distance between the opposed solenoid windings (FIG. 6B), one with zero pitch spacing (FIG. 6C), one with twice the number of windings as the optimized coil design (FIG. 6D) and one with a larger diameter than that of the optimized coil design (FIG. 6E). The coils were constructed on plastic formers that measured about 9 French or about 14 French in diameter. Copper wire of about 30 AWG was used to wind the solenoid elements. The opposed solenoids were tuned to 63.6 MHz and matched to 50 Ω using variable capacitors. Active detuning was provided via a choke and PIN diode.

Loaded Q measurements were obtained for each coil using a reflection-type measurement from $S_{11}$ polar plots. $S_{11}$ measurements were obtained from an HP 3577A Network Analyzer with S-parameter test set (Hewlett Packard, Palo Alto, Calif.). Measurements were performed with the coils placed in the lumen of a uniform saline phantom.

Figure 7:
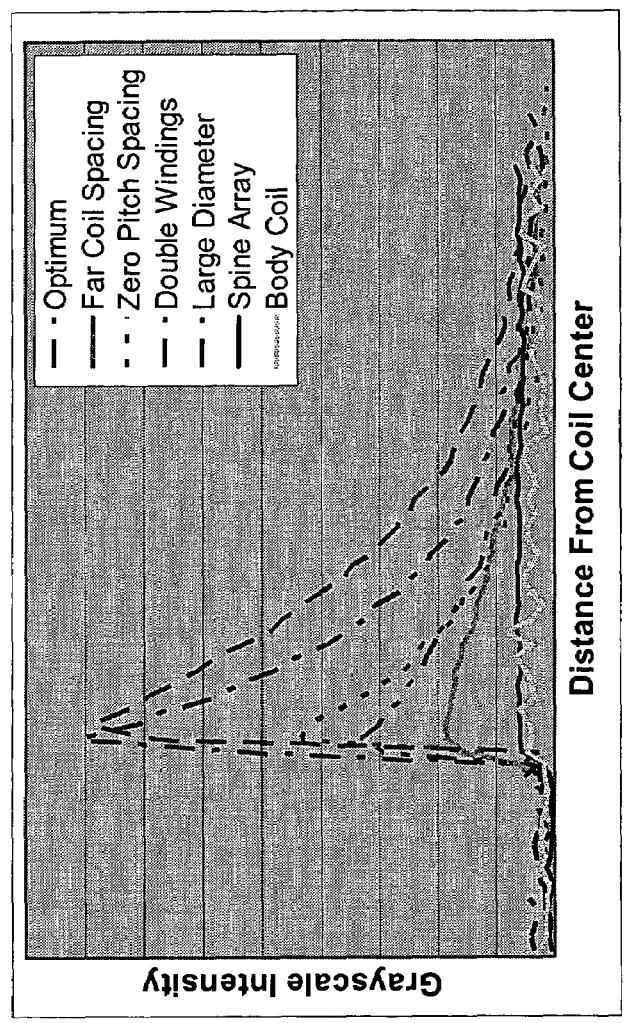
FIG. 7 depicts uniform phantom imaging studies conducted with the five opposed-solenoid imaging coils of FIGS. 6A-6E.
Figure 7:
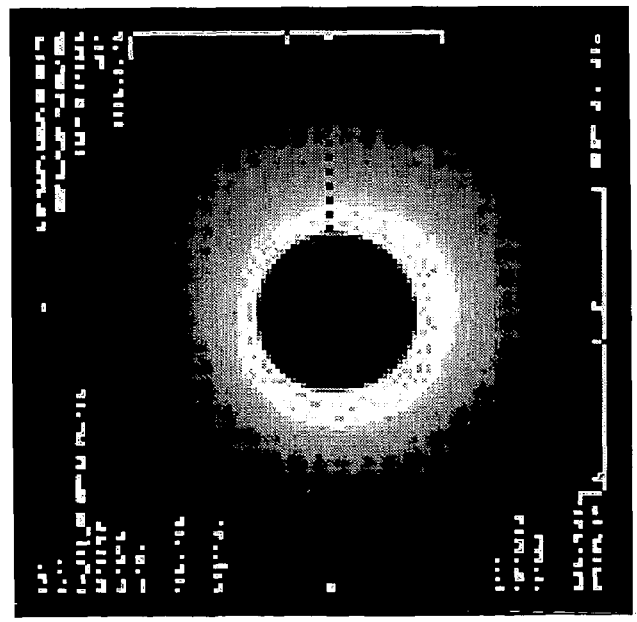

Imaging experiments were conducted using the same saline phantom on the Siemens Magnetom Sonata 1.5T whole body clinical imager (Siemens Medical Solutions, Erlangen, Germany) described above. Small diameter transmission lines and connectors were used to link the opposed solenoid imaging coil to a Siemens flex-loop interface which, in turn, interfaced with two of the eight RF receivers. The RF receiver channels on the MR system have a ±250 kHz maximum bandwidth. The MR system has 40 mT/m maximum amplitude gradients and a minimum gradient slew rate of 200 mT/m/ms. RF excitation was performed using the standard body coil. The system was configured via the standard user interface. The saline phantom was placed substantially in the center of the magnet and the imaging coils were placed substantially horizontally, along $B_0$, substantially in the center of the saline phantom. A Segmented EPI sequence was used for imaging (TR/TE=1520/38 ms, α=90°, SL=3 mm, Matrix=128×128, FOV=40 mm²). Line intensity plots were taken from the image and grayscale intensities were compared for each of the different coils (FIG. 7).

An optimized, opposed-solenoid imaging coil was created and mounted on a 5-French catheter. Each solenoid included 5 windings of 30 AWG copper wire with a pitch spacing of approximately one wire diameter. The individual counter-wound solenoid coils were placed about 10 mm apart. The antenna was tuned and matched using surface mount capacitors, and a micro-coaxial cable was utilized to provide capacitive coupling to the MR receiver. Porcine imaging experiments were also conducted on the 1.5 T Siemens Sonata imager. The catheter was placed in both the vena cava and the iliac artery, and imaging was performed both in vivo and in situ. True FISP imaging techniques that have been previously defined as suitable for micro-imaging applications were utilized for high-resolution vessel wall imaging.

Figure 8:
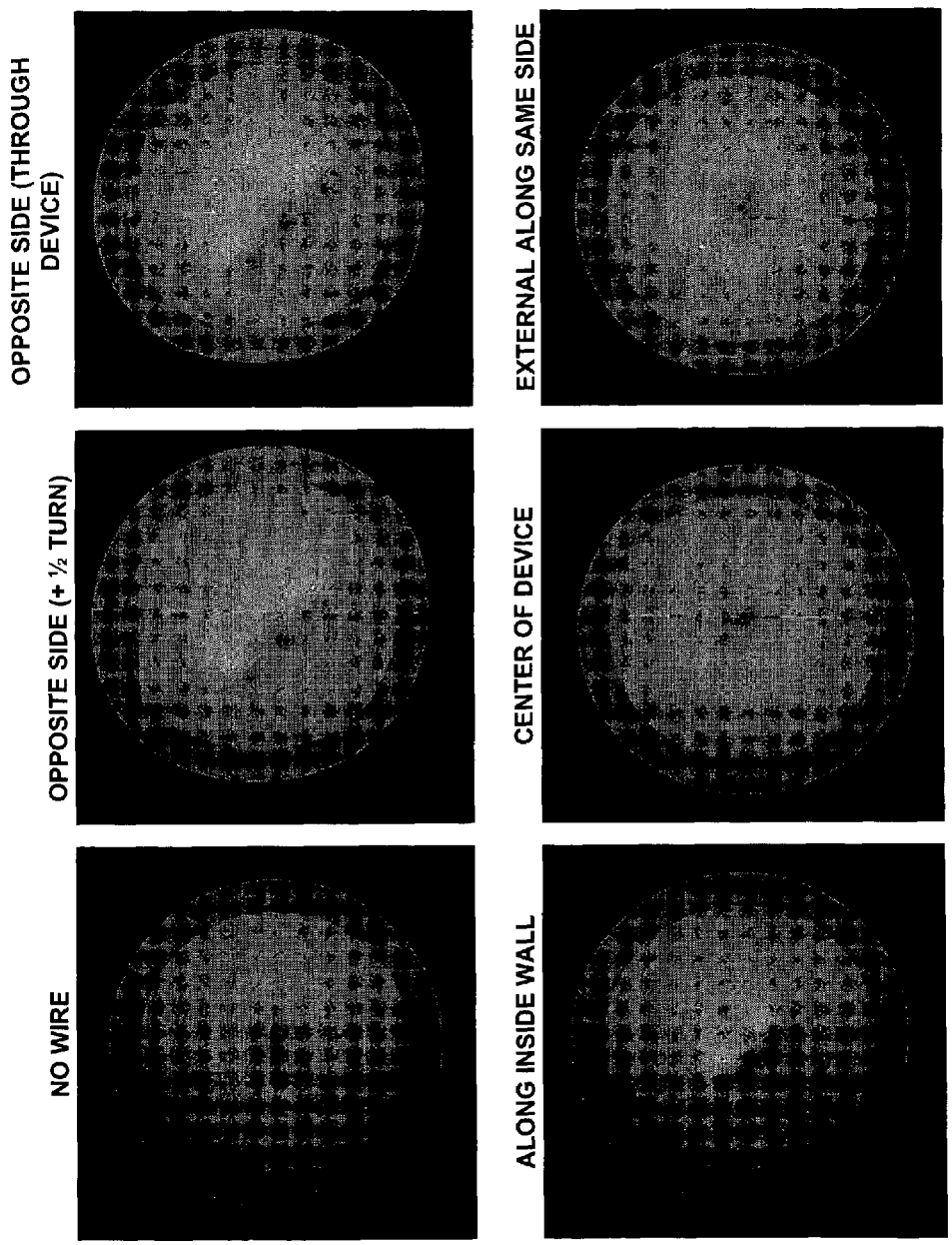
FIG. 8 shows Biot-Savart simulation results obtained for different placements of wires connecting opposed solenoid windings.

Simulation results were obtained for each axis and transverse sensitivity plots ($B_{xy}$) were calculated using the root sum square of the transverse components ($B_x$ and $B_y$). $B_{xy}$ plots obtained from simulation results for each of the different wire configurations are shown in FIG. 8. Distortions from a true circular pattern in the radial homogeneity as well as inhomogeneities in the sensitivity of the opposed solenoid coil are observed when placing the connecting wires on opposite sides of the interventional device. Field distortions are also observable when the wires are placed inside the interventional device. When the wire was placed in the center of the device and along the same side of the device, only very slight distortions are observed. Examining the opposed solenoid without connecting wires, no field distortions were observed.

Figure 9:
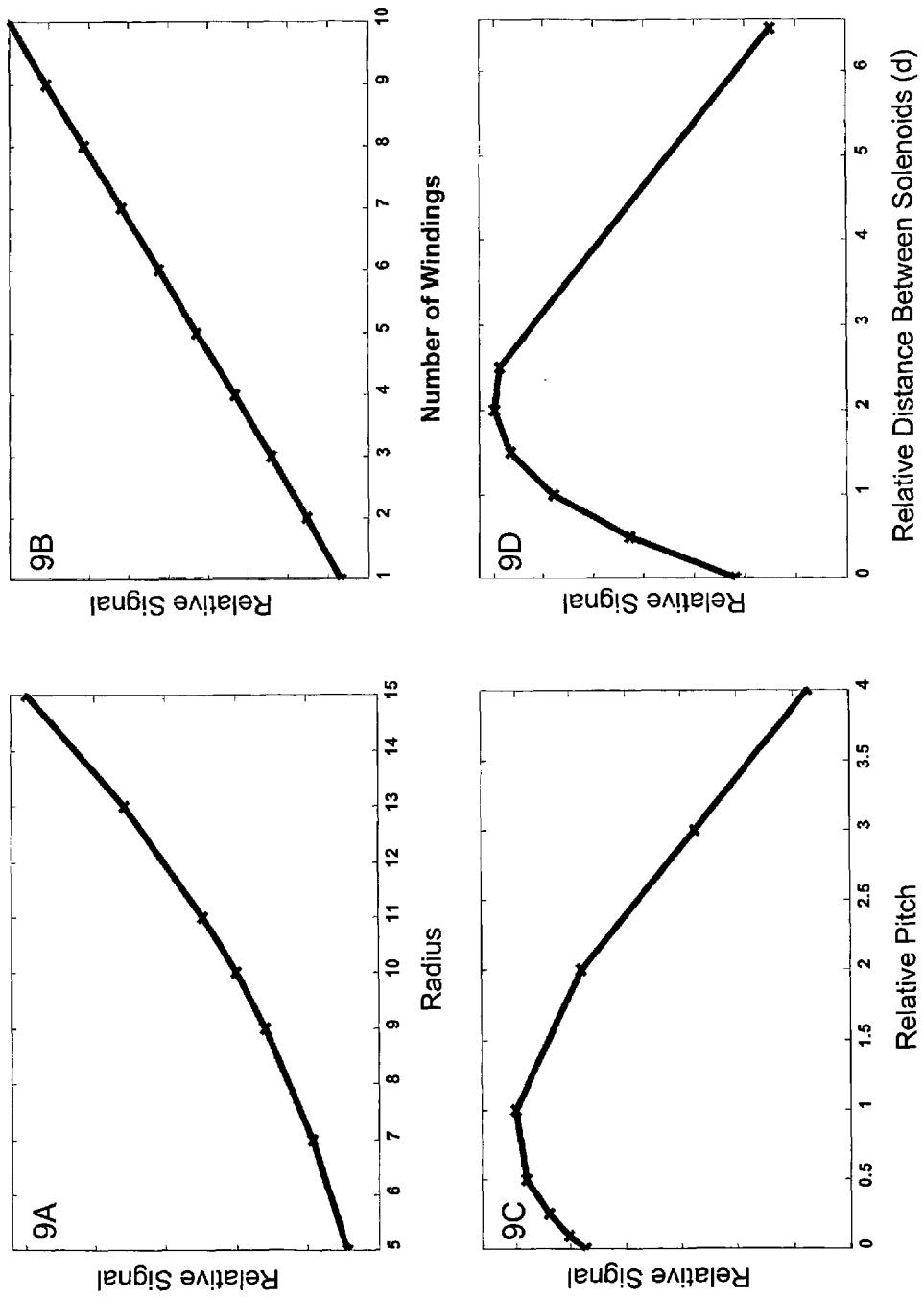
FIG. 9 (A-D) show Biot-Savart simulation results for different coil construction parameters of the coils depicted in FIGS. 6A-6E.

Bio-Savart simulation results based on the different coil design parameters show the following trends: (1) a direct relationship between coil radius and $B_{xy}$ (FIG. 9A) (2) a direct relationship between number of windings and $B_{xy}$ (FIG. 9B) (3) a parabolic relationship between pitch and $B_{xy}$ with a maximum occurring at a spacing equal to about one diameter of the wire (FIG. 9C) (4) and a parabolic relationship between $B_{xy}$ at a given radial imaging depth and coil separation with a maximum of about 2 to about 3 times the diameter of the coil (FIG. 9D).

When examining the test coils for simulation validation, $Q_{LOADED}$ measurements obtained for each of the different coils was measured to be approximately 30 for each configuration. Values for each coil are shown in Table 1. Line plots taken from phantom imaging studies reveal the maximum signal intensity and signal roll-off characteristics for each of the coils examined (FIG. 7).

TABLE 1

| Coil | Center Freq. (MHz) | BW (MHz) | $Q_{LOADED}$ |
| --- | --- | --- | --- |
| A: Optimized | 63.675 | 2.175 | 29.28 |
| B: Far Coil Spacing | 63.700 | 1.950 | 32.67 |
| C: Zero Pitch Spacing | 63.675 | 2.1 | 30.32 |
| D: Double Windings | 64.650 | 2.025 | 31.93 |
| E: Large Diameter | 63.650 | 1.85 | 34.41 |

Figure 10:
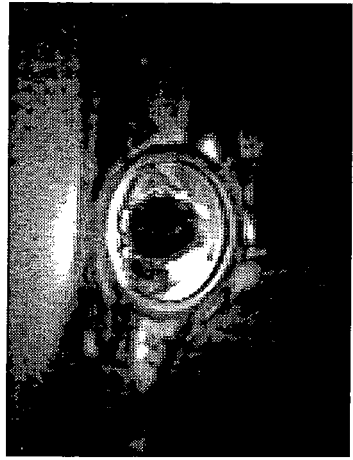
FIG. 10 (A-D) show in vivo and in situ images obtained from a porcine imaging experiment.
Figure 10:
Figure 10:
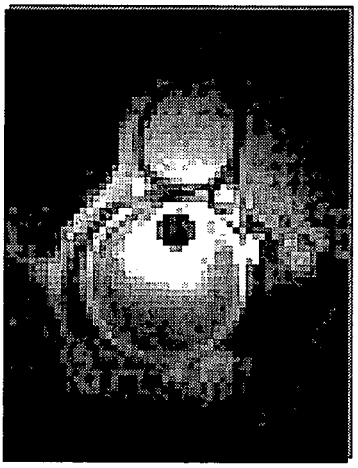
Figure 10:
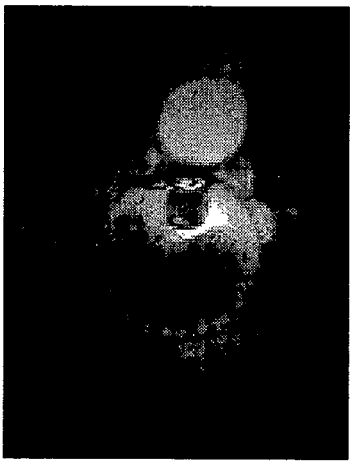

In vivo and in situ porcine imaging experiments show vessel wall structures and surrounding vasculature being resolved (FIG. 10). In vivo images (10A-10B) were obtained with a temporal resolution of about 15 seconds per slice and an achieved in-plane resolution of about 240 μm. In situ imaging results (10C-10D) show an in-plane resolution of about 160 μm, and images were acquired with a temporal resolution of about 9 seconds per slice. In both imaging experiments, image resolution and SNR were sufficient to depict a thickening of the adventitia and the media of the vessel wall.

Biot-Savart simulation model the performance of receiver coils use din intravascular imaging applications. The ease with which parameters can be adjusted make this method of investigation preferred over the construction of several coils to examine how individual parameters can affect coil SNR and homogeneity.

The results of Biot-Savart simulations for connecting wire placement show that placement of the wires either in the center of the interventional device or along the same edge of the device is preferable for maintaining field homogeneity. There is a potential with these two methods of a loss of a usable lumen in a standard catheter if the connecting wires are to be placed in the center, and the presence of small field inhomogeneities near the wires if they are placed externally along the same side of the interventional device. Even with this potential limitation, these two methods still provide superior field homogeneity over configurations wherein the wires are placed on opposite sides of the device or along the inside wall of the interventional device. The field inhomogeneities observed in these configurations may be due to the "loop antenna"-like configuration created when the wires are placed in such a fashion.

Two of the simulation's variables show monotonic increases in $B_{xy}$ without theoretical bounds, but instead are limited by physical constraints. The dimensions of the vasculature to be investigated ultimately limit the diameter of the solenoid. While maximizing device size, it is also important to maintain sufficient space for avoiding issues such as vessel occlusions and/or loosening plaque components. The number of windings of the solenoid is also subject to physical limitations. These include the increase in resistance that comes from increased use of wire necessary to increase loops, which lowers the overall Q of the circuit. The inductance of the solenoid also increases as the number of windings increases. In order to create a resonant circuit, the inductor is matched with a capacitor to define a resonant frequency. A balance may be struck with the capacitor; extreme values generally are not to be utilized in a circuit. Therefore, about 5 to about 10 windings are used to maintain this balance. A parabolic relationship is observed when altering the pitch of the windings, with a maximum occurring at pitch spacing of one wire diameter. Less spacing results in field line cancellation between winding elements, while increasing the spacing beyond optimum results in the loss of flux linkage between the winding elements of the solenoid. With the spacing of the two coils in an opposed solenoid configuration, a maximum is seen when the coils are placed at a distance approximately two to three times that of the diameter of the solenoid coil. The distance between the opposed solenoid coils may be maximized to increase the length of vessel that can be imaged without necessitating the repositioning of the imaging coil. However, too great of a separation distance may result in signal losses due to lack of field-line coupling between the two opposed solenoid coils.

Variable capacitors, for circuit tuning and matching, were utilized in the construction of coils for simulation validation. They avoided inexact tuning and matching that would result from the use of surface mount capacitors with discrete capacitance values. Substantially accurate tuning and matching through variable capacitors was achieved at the cost of slightly lower overall Q values. However, similar Q values were obtained from measurements taken for each of the opposed solenoid coils. Uniform phantom imaging experiments reveal that the coil design provides high signal intensity and less signal roll-off as compared with other coil designs of the same diameter. When compared with the larger diameter coil, the performance of the optimized solenoid is nearly equivalent in a device that is 35% smaller than the non-optimized 14F opposed-solenoid imaging coil. Obtaining equivalent performance in a smaller-diameter coil is advantageous, as it would allow for the interrogation of smaller blood vessels.

Porcine imaging experiments reveal the ability of the coil to resolve vessel wall structures. In vivo imaging reveals the vessel wall and surrounding vasculature with minimal motion artifact and good radial homogeneity. In situ imaging allows for even smaller FOV imaging at the expense of longer acquisition times. Structures of the vessel wall are depicted at a resolution of approximately 200 µm.

Figure 11:
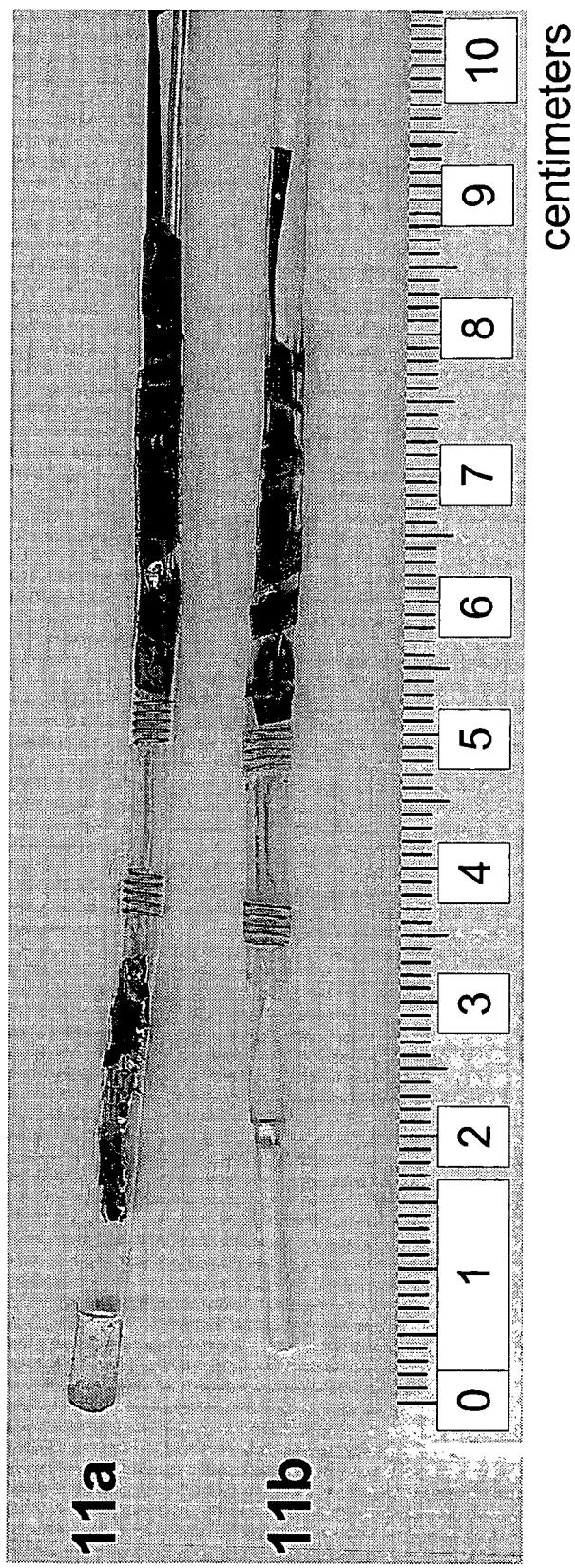
FIG. 11 shows the opposed solenoid array (a) and a single-channel opposed solenoid antenna (b)

While the aforedescribed coils are well suited for either tracking or imaging, a phased-array coil that advantageously combines both features will now be described. Referring now to FIG. 11, two independent solenoid coils were wound in opposite direction on a cylindrical form. When considered together, the design and geometry may appear to be similar to that of a conventional opposed solenoid antenna. However, each coil may be individually tuned, for example to 63.6 MHz, matched to 50 Ω, and connected to a separate receive channel of the MR system. Each coil could therefore be turned on or off independently during the MR experiments, and signals from the single coils could be processed together or independently depending on whether the tracking or imaging mode was being chosen. Each coil may therefore have a unique and well localized sensitivity for tracking. The combined coils have an extended length of high radial homogeneity between the individual elements for high-resolution imaging.

A copper wire of about 30 AWG was used for both coils. Each solenoid probe had a 5F diameter, included 5 windings, and had a length of 4.5 mm. The gap between the coils was chosen to be about 1 cm based on Biot Savart simulations using the boundary conditions of a 5 F coil diameter. Tuning, matching, and passive decoupling with crossed diodes was performed on the tip of the catheter device in order to reduce electrical losses. The coil was encased in a biocompatible polymer shrink tubing over a length of about 40 cm. The maximum outer diameter of the prototype imaging/tracking catheter was about 12 F at the location of the tune, match and passive decoupling circuitry.

In addition, a single channel opposed solenoid coil (i.e., not phased array) of identical geometric size and primary winding distributions was built for performance comparison (FIG. 11b). Both the conventional opposed solenoid and the two elements of the phased array were connected using micro-coaxial cable.

All experiments were performed on a 1.5 T whole body scanner (Magnetom Sonata, Siemens Medical Solutions, Erlangen, Germany), equipped with eight RF receivers each with ±250 kHz maximum bandwidth, as described above. The MR system had 40 mT/m maximum amplitude gradients and a minimum gradient slew rate of 200 mT/m/ms. RF excitation was performed using the standard body coil. The integrated panoramic array in combination with the real-time scanner interface allowed variable coil selection and combination on separate receiver channels including individual or combined image data processing, respectively. The system was configurable via the standard user interface. Imaging and tracking software implementing a subset of aspects of the systems and methods described herein was employed (e.g., on a Siemens Integrated Development Environment for Applications (IDEA) platform and Image Calculation Environment (ICE) platform) for pulse sequence design and image reconstruction. IDEA and ICE are built upon the C++ programming language, which provides a high level of software flexibility.

Measurements of the quality factor, Q, were performed for the single channel opposed solenoid coil and for each individual element of the micro-coil array, and compared to each other. Unloaded and loaded coil Q measurements were made. Unloaded Q's were measured by suspending the coil in air away from conductive material; loaded Q was measured by placing the coil in a saline filled phantom. Both unloaded and loaded Q was calculated from the polar plot of an S11 reflection type measurement on a network analyzer.

To compare the general signal characteristics of the coil array with the conventional single-channel opposed solenoid coil, multi-slice proton density weighted FLASH (TE 5 ms, TR 20 ms, flip angle 40°, matrix 5122, FOV 120 mm, SL 3 mm) images were acquired with the catheter probes placed along B0 within a vessel phantom. The phantom consisted of two concentric NMR sample tubes, that were sealed at one end, and inserted into a 200 ml plastic bottle. The cylindrical cavities were filled with different solutions of saline and copper sulfate to establish different contrasts between the inner lumen, the simulated vessel wall and the simulated non-vascular tissue.

The data received simultaneously from both elements of the coil array were reconstructed individually to assess the spatial separation of signal peaks, and also used to calculate combined images using Roemer's sum of square algorithm. These combined images were compared to those acquired with the single-channel opposed solenoid coil using the same imaging and slice parameters. The spatial separation of signals from both elements was measured from slices strictly coronal to the device. Profiles were plotted parallel to the catheter's longitudinal axis and the location of the highest peak intensity was identified for each element. If the distance between these peaks was in the order of the geometrical distance between the elements, the separation was considered to be sufficient.

Tracking and imaging capabilities of the coil configuration were tested in phantoms, and in vivo in 5 domestic farm pigs (25-42 kg bodyweight). All in vivo endovascular procedures were performed under general anesthesia in accordance with protocols approved by the institutional animal care and use committee (IACUC) at our institution. The induction of anesthesia was achieved via intramuscular injection with 4-6 mg/kg of a mixture of Tiletamine HCL and Zolazepam HCL (Telazol, 100 mg/ml, Lederle Parenterals, Inc., Carolina, Puerto Rico). Anesthesia was maintained through continuous intravenous infusion of a mixture of 2 mg/kg Xylazine (Xyla-Ject, 20 mg/ml, Phoenix Pharmaceutical, Inc. St. Joseph, Mo.) and 20 mg/kg Ketamine hydrochloride (Ketaject, 100 mg/ml, Phoenix Pharmaceutical, Inc, St Joseph, Mo.). After local anesthesia, a 14F sheath was inserted into the proximal femoral artery under ultrasound guidance. The coil was then advanced through this sheath and placed in the abdominal aorta at different levels close to the origin of the renal arteries.

Real-time device tracking and automated imaging slice positioning was performed using, for example, ICE/IDEA tracking software previously described. The tracking software incorporates three main components: (a) a fast, active device localization module, (b) data processing software that calculates a position and direction vector that define the 3D position and orientation of the catheter; these values were input into (c) a FISP or True FISP real-time imaging module, that used the updated scan plane parameters to acquire and reconstruct new image data online, that depicted the catheter and gross anatomical features. Due to the flexibility of IDEA and ICE no additional hardware or software was needed to perform all tracking, localization and slice position updating, other than the catheter coils.

Figure 12:
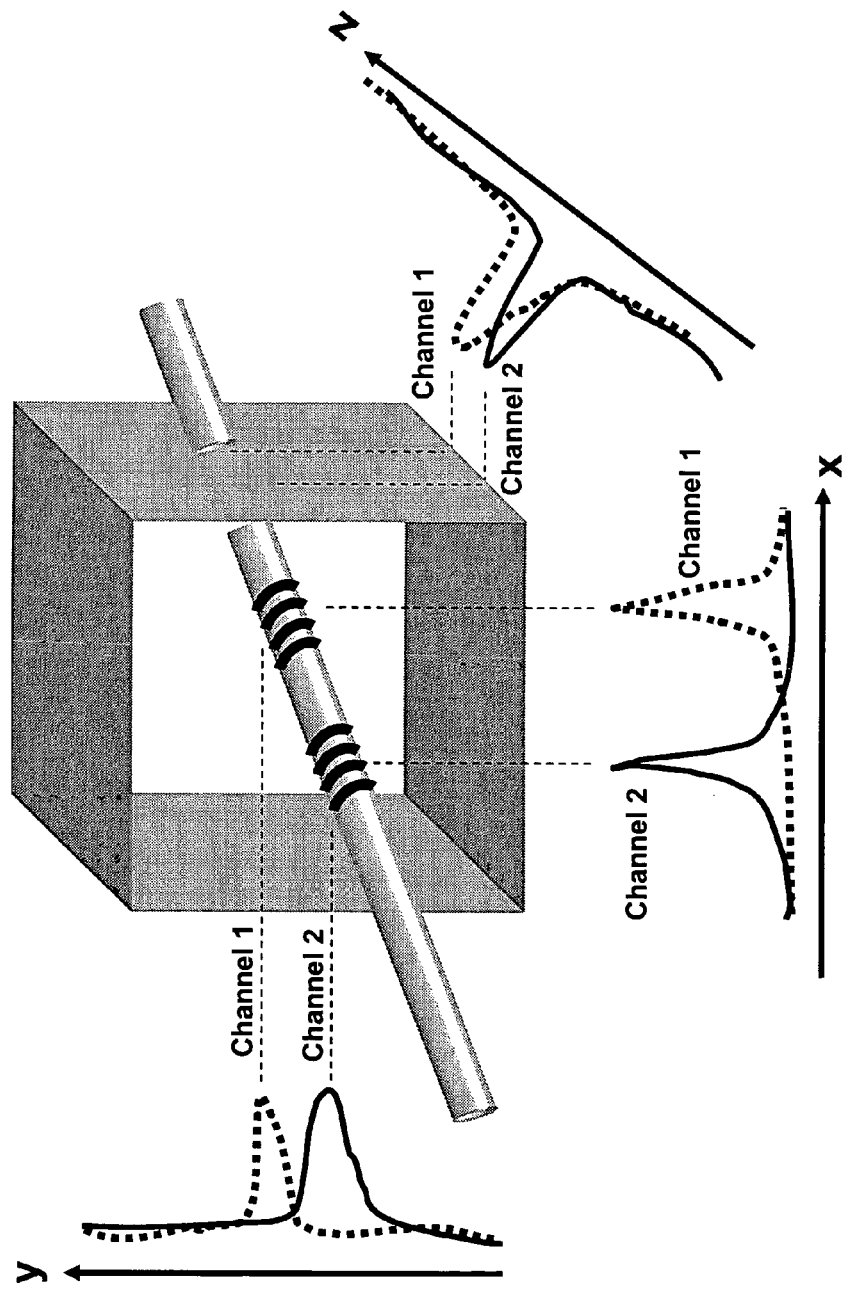
FIG. 12 shows schematically the implemented device localization method based on two-channel acquisition.

For active device localization, nonselective RF pulses were employed to excite all spins within the FOV. In subsequent scans, 1D projection signals (FOV 400 mm, matrix 1*256, TE 2.5 ms, TR 5 ms) from all 3 axes of the scanner were acquired. No coil other than the two-channel catheter coil array was used for signal reception during this first module (total acquisition time=15 ms). Due to the limited sensitivity of the solenoid coils mounted on the catheter, only spins close to the respective coil contributed to the signal acquired from the respective, individual channel (FIG. 12). Three projections (e.g. in the physical x-, y-, and z-directions of the magnet coordinate system or another possibly non-orthogonal reference coordinate system), and simultaneous signal reception via the two independent receiver coils/channels led to unambiguous determination of the position of each receiver coil in three dimensions. These positions were used to calculate the location and orientation of the subsequent imaging plane for device guidance.

A real-time FISP sequence with TE 3 ms, TR 6 ms, flip angle 15°, FOV 350×350 mm², matrix 128*128, slice thickness 5 mm, and a bandwidth of 250 Hz/Pixel was used for device guidance. The acquisition time per image was 768 ms, resulting in a frame rate of about 1.5 images per second. Spine- and body phased array coils were selected for signal reception. In addition, the elements of the catheter coil were also enabled during device guidance for a better visualization of the catheter's tip. They appeared as areas of high signal amplitude in the images.

In vivo tracking experiments in 5 domestic pigs were conducted using the previously described localization and guidance protocols. The two-channel micro-coil was inserted into the proximal femoral artery and advanced from the iliac artery to the abdominal aorta. The following experiments were conducted in a phantom and in the 5 pigs to test the tracking software performance with the newly proposed device, both in vitro and in vivo. First, the orientation and position of the tip of the catheter coil were determined via accurate manual localization using standard scout imaging. Then, 100 near-real-time image frames were collected with the device stationary and the system recalculating and refreshing the slice parameters for every frame from only the current localization information. Ideally, slice position and orientation should remain constant in its original state (i.e. centered on the tip of the stationary catheter coil) and should be identical to the values obtained manually with the scout imaging. Variations from the manually determined location and orientation were used to determine the standard deviation or accuracy of the tracking system. Finally, these tests were repeated with the catheter being moved within the water phantom and along the abdominal aorta, respectively. An imaging protocol option was chosen that was designed to position the tip of the catheter in the center of the updated frame. Deviations of the actually-depicted device position and the center of FOV were used as a measure of the system's accuracy during catheter advancement.

After successful guidance of the device to a remote site in the abdominal aorta, several high-resolution images of the vessel wall were acquired. Most imaging protocols used were based on the known steady state free precession technique TrueFISP. The following imaging parameters were selected:
 (a) In vivo imaging: TR 13 ms, TE 6.5 ms, SL 2.5 mm, 240 μm in plane resolution, FOV 23*30 mm, matrix 96*128, TA 15 sec/image.
 (b) In situ imaging: TR 14.6 ms, TE 7.3 ms, SL 2.5 mm, BW 130 Hz/Pixel, FOV 13*20 mm, matrix 80*128, in plane resolution ~160 μm, TA 9 sec/image.

Unloaded Q was 40 for the proximal element and 34 for the distal element; loaded Q's of 39, and 34, were measured with the coil placed in a saline filled phantom. The conventional opposed solenoid coil had an unloaded Q of 45 and a loaded Q of 40.

Figure 13:
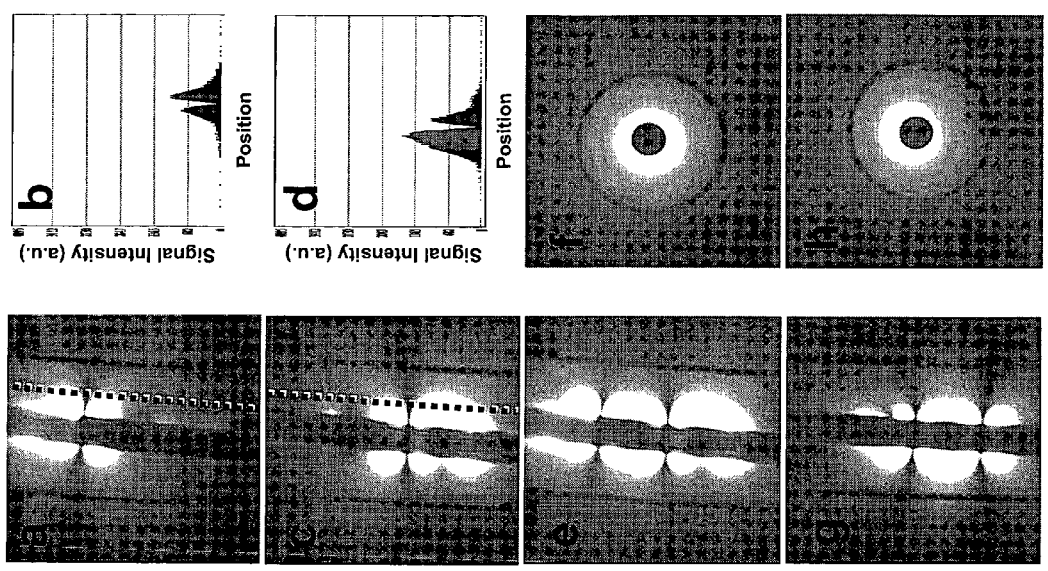
FIG. 13 shows axial and sagittal coil sensitivity profiles in a vessel phantom, wherein (a) and (c) show sagittal slices acquired simultanously with both elements;
(b) and (d) show the corresponding signal intensity profiles along the marked lines;
(e) shows the combined image calculated from (a) and (c),
(g) shows the corresponding slice acquired with the conventional opposed solenoid coil of the same size;
(f) and (h) provide axial slices through the center of the device for an array coil and a conventional coil.

FIG. 13 shows representative slices from FLASH experiments employed to explore the spatial sensitivity pattern of the phased array device in comparison to a conventional opposed solenoid coil. The images in FIGS. 13a and 13c show the spatial sensitivity of the individual coil elements along the longitudinal axis of the device—here, in a coronal plane through the center of the device. Corresponding profiles parallel to the long axis are depicted in FIGS. 13b and 13c, respectively. These profiles show a high-amplitude peak and a separation of the area of highest sensitivity for each coil element which is greater than the gap between the elements. This feature supports the advanced device localization method based on simultaneous projection data sets from both RF channels. Combined images, formed from the square root of the sum of squares of the images in FIGS. 13a and 13c, are depicted in FIG. 13e and compared to the respective coronal slice from the conventional opposed solenoid coil (FIG. 13g). The sensitivity patterns are found to be similar for both coil designs. Both share the comparable spatial profiles, sensitivities, and longitudinal B1 inhomogeneity including the typical regions of zero sensitivity that are inherent to opposed solenoid designs. A comparison of the axial sensitivity of both devices is performed in FIGS. 13f and 13h. The sensitivity of the micro-coil array and the regular coil is highest adjacent to their outer wall, both have B1 sensitivities that drop off rapidly, and both have profiles that are nearly identical in radial symmetry. There is substantially no observable difference in axial and longitudinal sensitivity. Thus, the array coil is well suited for high-resolution imaging, as was the single channel coil.

Figure 14:
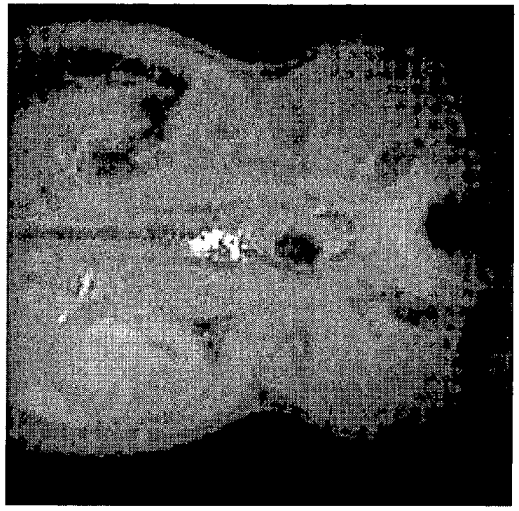
FIG. 14 shows porcine imaging tracking experiments in vivo using the opposed solenoid phased array coil.
Figure 14:
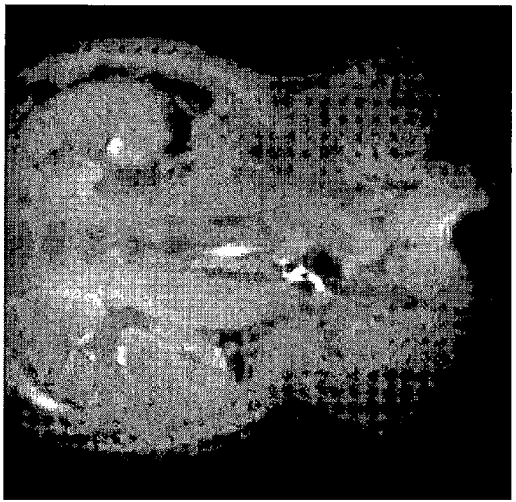
Figure 14:

Catheter advancement and retraction were successfully tracked in both vessel phantom and porcine imaging experiments. FIG. 14 shows representative slices from a real-time movie acquired in the abdominal aorta of a pig. Device tracking and automated slice positioning (location and orientation) was judged to be reliable, robust, and accurate in over 1000 tracking/imaging frames. The software automatically updates the scan plane and orientation and the elements can be individually switched on or off during image acquisition. The measured success rate was 100% for the motionless catheter; the error rate for the moving catheter in the aorta was less than 3%. In phantom and in vivo experiments, the inaccuracy was found to be less than 2 mm of displacement error and of 2° orientation error.

Figure 15:
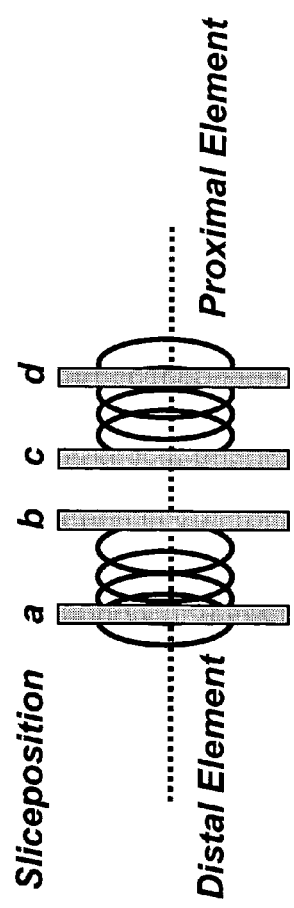
FIG. 15 shows In vivo TrueFISP imaging from inside the abdominal artery of a pig.
Figure 15:
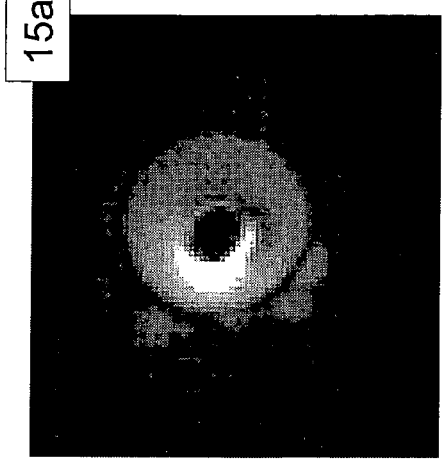
Figure 15:
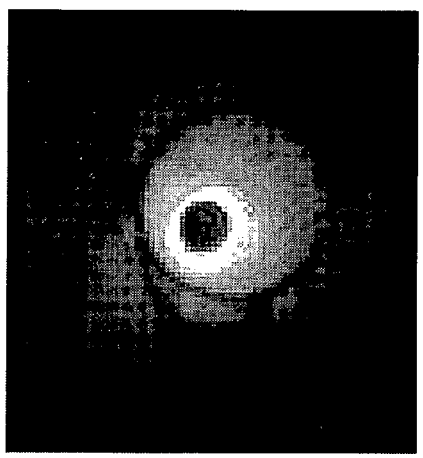
Figure 15:
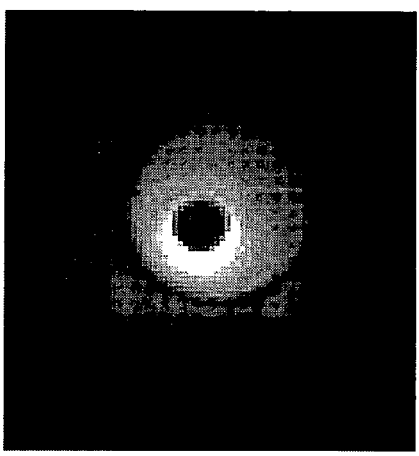
Figure 15:
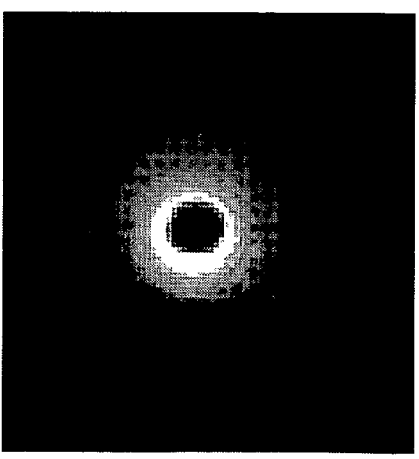

FIG. 15 shows an in vivo example where the device location information was successfully used for automated slice positioning and then for vessel wall imaging. An in-plane resolution of 240 μm was achieved within 15 sec per slice in these images of the vessel wall. Substantially, no artifacts from arterial flow or device motion compromise the image quality, which confirms the array coil's capability for high-resolution endovascular imaging.

Figure 16:
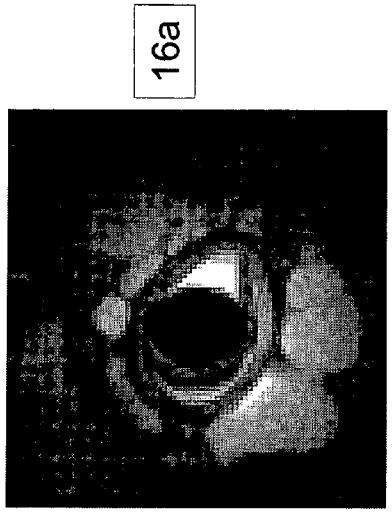
FIG. 16 shows In situ TrueFISP imaging of the abdominal aorta using the catheter array coil.
Figure 16:
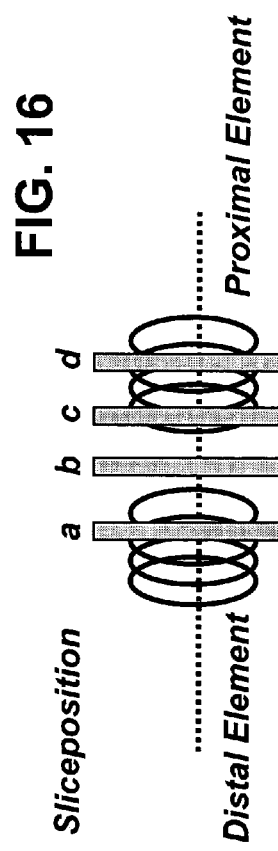
Figure 16:
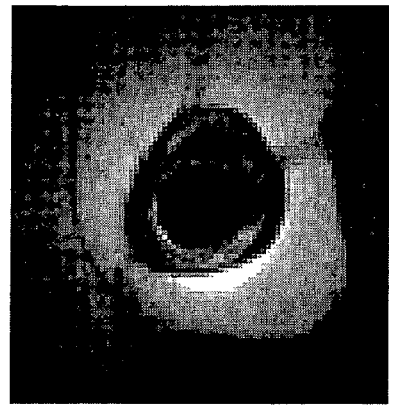
Figure 16:
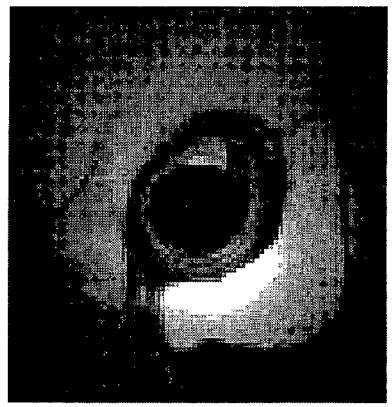
Figure 16:
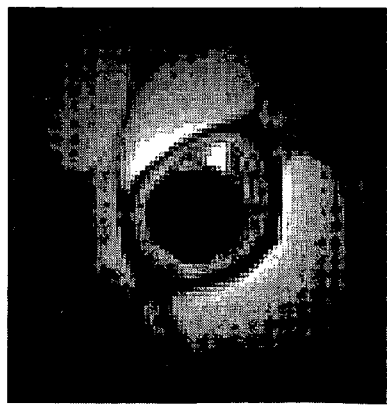

FIG. 16 depicts representative slices out of a dataset acquired in situ using the phased array micro-coil. These images have an in plane resolution of 160 μm and were acquired in 9 sec per slice. Resolution and signal-to-noise ratio were sufficient to depict in the deceased animal (a) the collapsed arterial vessel wall (compare to the substantially round shape of the aorta in vivo (FIG. 15)), and (b) a pronounced thickening of two layers of the vessel wall, the adventitia (outermost black ring structure (arrow)) and media (adjacent grey rim (arrowhead)). Furthermore, a non-uniform signal-to-noise level was observed in the individual images of this series due to longitudinal B1 inhomogeneity of opposed solenoid devices.

The disclosed dual-purpose device for simultaneous MR tracking through the vascular system and high-resolution imaging of the vessel wall incorporates concepts from array coil technology, since two solenoid coils, that are wound counter to each other, are mounted on a conventional catheter, and connected to individual receiver channels of the MR system. In combination with 3 gradient projections, each coil provides the unique opportunity for fast device localization. The complete localization process is accomplished within about 15 ms.

Device position and orientation can be determined easily and unambiguously if tracking is done with both coils. Peak ambiguity is a known problem and reported in earlier work on active device tracking, especially when single-channel devices are used. Previously, more than 6 projections were acquired and additional post-processing (e.g. cluster analysis) was performed to correctly identify peaks. This is more than double the acquisition time compared to the localization method disclosed herein. These additional acquisitions and computations may be avoided by using a two-channel approach. Furthermore, the tracking accuracy will not be compromised when using the dual-channel device, as demonstrated when compared with accuracy measurements results obtained with similar tracking software and a dedicated 2-marker single channel tracking antenna.

Phantom and in vivo experiments as well as direct comparison with a conventional opposed solenoid coil of equal geometry demonstrate that the proposed phased array design provides opposed solenoidal imaging performance if the signals from the two independent receiver channels are combined appropriately.

According to another practice, a coil-less and/or wireless tracking device can be advantageously employed for tracking and visualization of a catheter in interventional MRI. Passive tracking methods using susceptibility artifacts can provide adequate catheter visualization. However, these methods are dependent on the orientation of the device (coil) in the magnetic field and on the slice thickness of the acquired image acquisition. Active tracking methods utilizing tuned microcoils provide accurate localization for scan plane determination, but are not as useful for steering catheters through the complex vasculature because of their point-like nature. Guide wire antennas provide a larger field-of-view for catheter visualization/profiling, but suffer from local heating which may result in significant tissue damage.

The disclosed device is based on the selective excitation of a chemically-shifted NMR signal source within a catheter. This tracking/profiling method can provide the necessary selectivity and large field of view for catheter visualization necessary to allow catheter steering when overlaid onto a previously acquired roadmap image. This new device provides the same capabilities as guide wire antennas without the risks of localized tissue heating.

A prototype catheter was created by infusing 1 ml of concentrated acetic acid ($\sigma$~7 ppm) doped with 1 mM Gd contrast (Magnevist™, Schering AG) into a plastic 1 ml syringe (ID=4.7 mm). This solution provides a signal source with a proton chemical shift frequency distinct from typical tissue protons. The syringe was placed into a vascular phantom and near a volunteer's head to develop the tracking/profiling sequence. A FLASH (Fast Low Angle SHot) sequence was developed with a 10 ms chemical shift selective excitation (CHESS) pulse to excite the off-resonance spins (TR/TE/FA=20 ms/10 ms/30°). No slice-select gradients were applied in this sequence. Gradient shimming was applied prior to the image acquisition to limit the effects of field inhomogeneities. Imaging acquisitions toggled between CS-FLASH and conventional FLASH to provide alternate catheter and anatomic images. The images from the chemical shift-selective FLASH sequence (CS-FLASH) were compared with standard slice-selective FLASH (TH=5 mm) to demonstrate the capability for acquiring catheter-only images to be overlaid onto previously acquired anatomic images needed for catheter steering.

Figure 17:
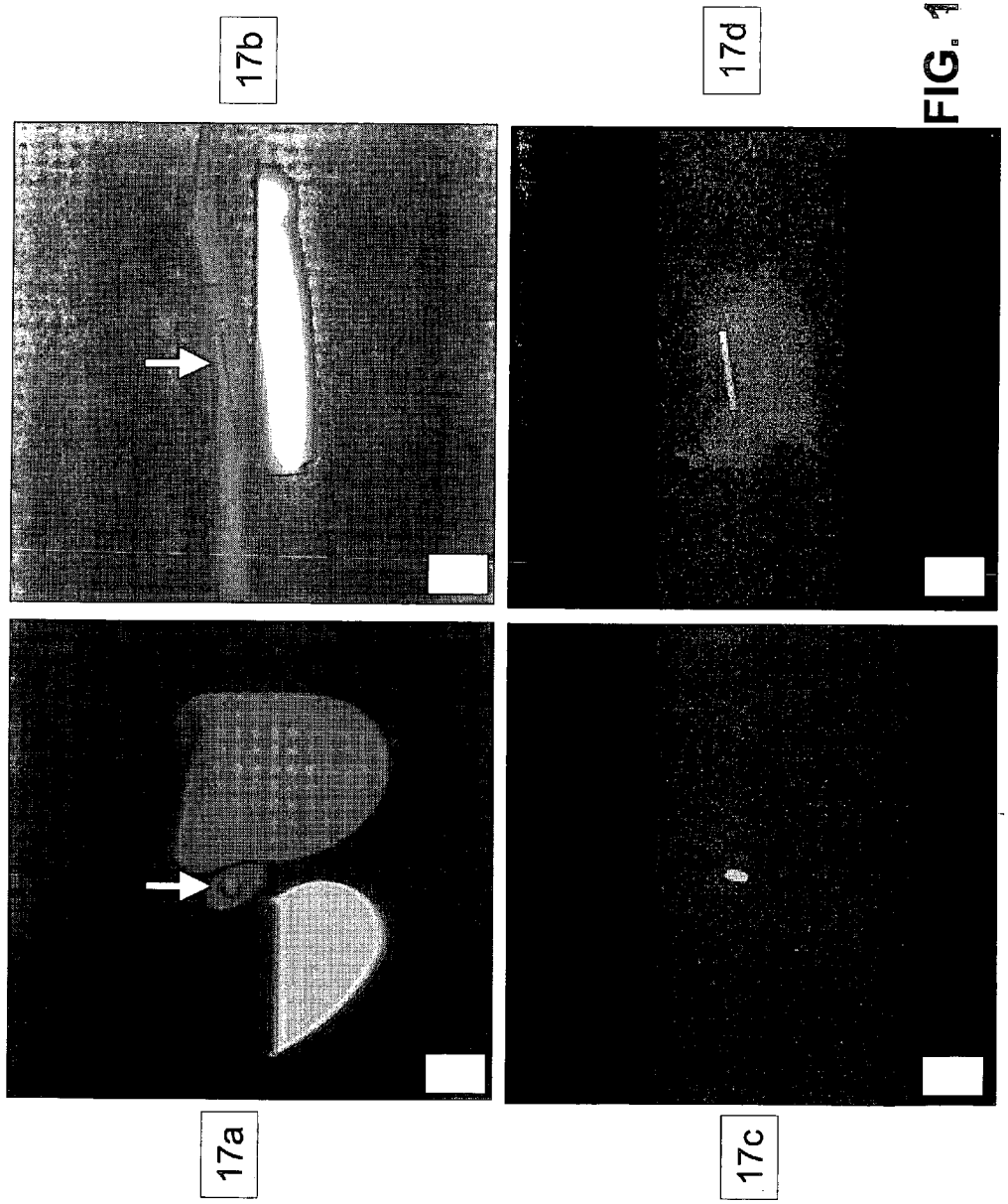
FIG. 17 shows vascular phantom images. (a, b) Axial and sagittal slice-selective FLASH images with acetic acid catheter (arrows). (c, d) Axial and sagittal CS-FLASH images with selectively excited catheter clearly visible.
Figure 18:
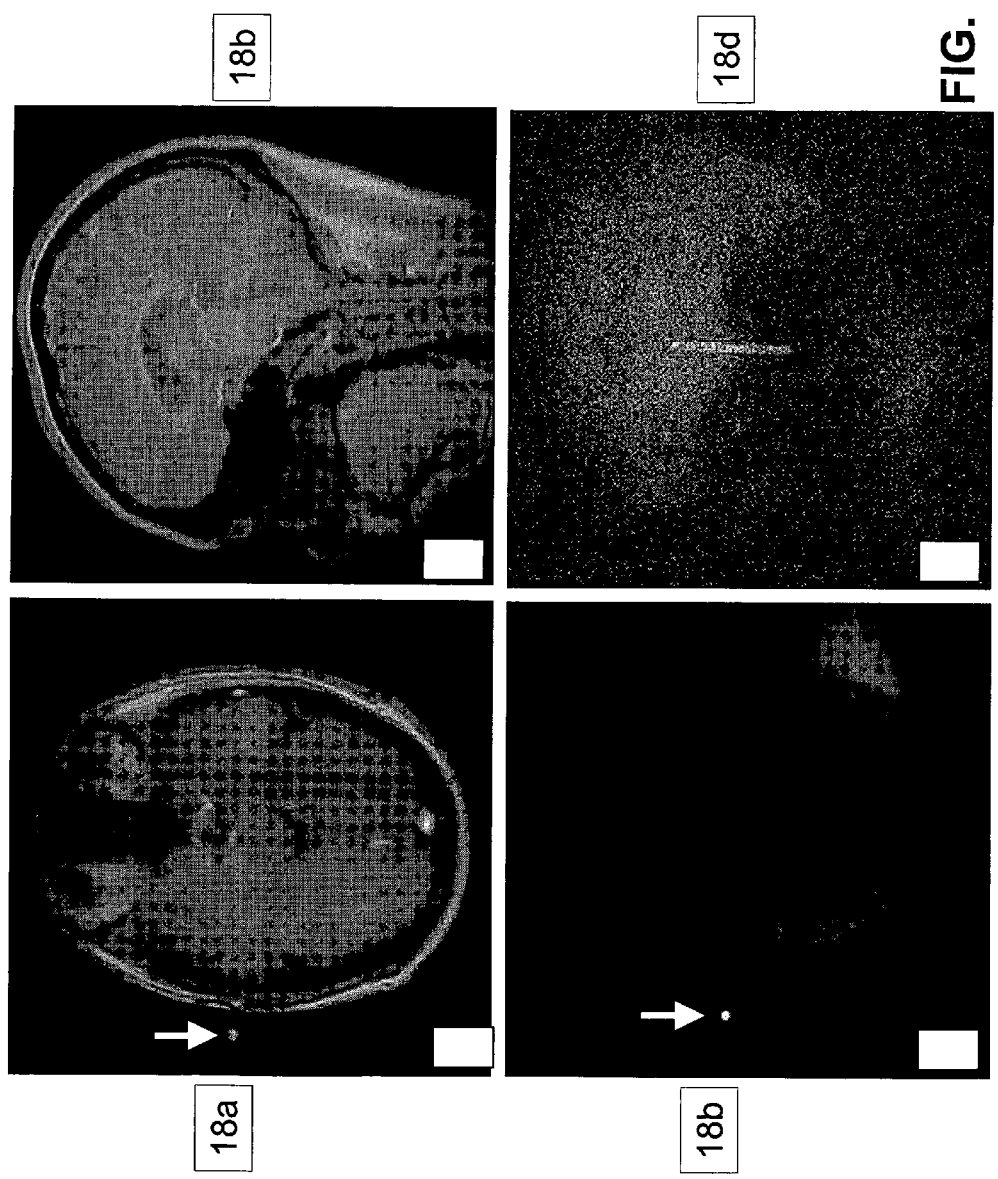
FIG. 18 shows human volunteer images. (a, b) Axial and sagittal slice-selective FLASH images with acetic acid catheter (arrows). (c, d) Axial and sagittal CS-FLASH images with catheter selectively excited in projection images.

Axial and sagittal views of the vascular phantom and volunteer head images are shown in FIGS. 17 and 18, respectively. FIGS. 17a,b and 18a,b are FLASH images with a slice-selective excitation pulse. The acetic acid syringe is identifiable within the vascular portion of the phantom and near the volunteer's left ear in the axial image (FIG. 18a). FIGS. 17c,d and 18c,d are from the CS-FLASH sequence with the CHESS pulse resulting in the "catheter-selective" images. In an in-vivo intravascular procedure the sagittal catheter-selective image (FIG. 18d) would be overlaid onto the corresponding anatomic image (FIG. 18b).

A contrast ratio (or selectivity) of approximately 2:1 was observed for the aforedescribed chemically-shifted probe using acetic acid. This contrast ratio may be insufficient to track the probe in vivo, in particular when using active tracking. The contrast ratio is hereby a measure of the signal from the probe relative to the signal from the surrounding tissue. A low-contrast ratio may lengthen the data acquisition time which would be unacceptable for vascular imaging. Interfering noise from other sources may add to the difficulty of extracting a useful signal for tracking purposes. In addition, probes used in vivo have to meet certain biocompatibility standards.

Adverse health effects can result from exposure to the materials from which a device is made. The biocompatibility of a device depends on several factors, especially the type of patient tissue that will be exposed to device materials and the duration of the exposure. The tracking device should be biocompatible at least in the following aspects: (1) no introduction of sublethal or lethal effects as observed at the cellular level (Cytotoxicity); (2) no localized reaction of tissue to leachable substances (Intracutaneous Reactivity); (3) no adverse effect occurring within a short time after administration of a single dose of a substance (Acute Systemic Toxicity); and (4) no undesirable changes in the blood caused directly by a medical device or by chemicals leaching from a device (Hemocompatibility). Undesirable effects of device materials on the blood may include hemolysis, thrombus formation, alterations in coagulation parameters, and immunological changes.

Suitable biocompatible materials for vascular tracking and imaging are, for example, fluorinated compounds, such as fluorinated ethylene, polyether urethanes, and more particularly propylene polytetrafluoroethylene (PTFE). These compounds can provide an enhanced signal over the signal derived from the chemically-shifted probe. The contrast ratio can be further enhanced by labeling the compounds with stable isotopes. For example, compounds labeled with stable isotopes such as Glucose-1-$^{13}$C and Glutamic-$^{13}$C acid are used in Magnetic Resonance Imaging (MRI) techniques to render visible metabolic changes. MRI tracking probes made of, for example, fluorinated hydrocarbon compounds can be labeled with $^{13}$C, whereas biocompatible azo-compounds can be labeled with $^{15}$N. In this way, the MRI system can discriminate between the MR signal from the carbon atoms in the catheter itself and the MR tracking signal from the labeled PTFE of the probe. A catheter probe could then be fabricated entirely of a solid material that can be attached to or integrated with the catheter itself. When using fluorocarbons or boric acid instead of acetic acid, a contrast ratio or selectivity of greater than 5:1, and even 10:1 or 20:1 can be achieved.

In another embodiment, the acetic acid in the liquid-filled lumen described above can be replaced with boric acid. Boric acid produces a signal with a greater bandwidth, for example, 3 MHz at 1.5 Tesla, and can in addition be tagged with $^{11}$B. The boric-acid-filled lumen can also contain a contrast material. The improved contrast ratio or selectivity are in particular beneficial for spiral imaging and other MRI signal acquisition techniques where k-space data have to be acquired within 100 msec or less.

Two FLASH sequences are used to acquire both the anatomical and catheter-selective images. However, other combinations of sequences and materials can be used to optimize the anatomic and catheter imaging independently for the particular interventional procedure (i.e., optimized for speed, catheter/background contrast, tissue/vessel contrast, resolution variations between images, etc.). The bandwidth, center frequency, and the magnitude and phase of the CHESS pulse can also be modified to generate images with selected suppression bands allowing for better visualization of the catheter within the vasculature. The method is easy to implement on conventional scanners and requires only a single receiver channel. The sequence and catheter design can be further optimized, including construction with fully biocompatible materials and a reduction in catheter size, facilitating realtime in-vivo active tracking for intravascular catheters.

While the invention has been disclosed in connection with the preferred embodiments shown and described in detail, various modifications and improvements thereon will become readily apparent to those skilled in the art.

What is claimed is:

1. A method, comprising:
    applying a FLASH magnetic resonance (MR) pulse sequence to a body in which a wireless magnetic resonance imaging (MRI) tracking probe is inserted, where the FLASH MR pulse sequence excites a first signal source adjacent to the wireless MRI tracking probe, the first signal source having a first MR excitation frequency, the first signal source being associated with the body in which the wireless MRI tracking probe is associated;
    applying a CHESS MR pulse sequence to a region in the body in which the wireless MRI tracking probe is inserted, where the CHESS MR pulse sequence excites a second signal source having a second MR excitation frequency, the second signal source being associated with the MRI tracking probe;
    acquiring a first image, where the first image is of a portion of the body in which the wireless MRI tracking probe is inserted, the first image being based on RF signals associated with the first signal source;
    acquiring a second image, where the second image is of at least a portion of the wireless MRI tracking probe, the second image being based on RF signals associated with the second signal source; and
    selectively tracking the MRI tracking probe by alternating between displaying the first image and the second image on a display;
    wherein the second signal source being one of, the MRI tracking probe, and a material located in the MRI tracking probe; and
    wherein the MRI tracking probe being manufactured, at least in part, from PTFE, and where the method includes controlling the CHESS MR pulse sequence to excite PTFE.

* * * * *

UNITED STATES PATENT AND TRADEMARK OFFICE
CERTIFICATE OF CORRECTION

PATENT NO. : 7,596,402 B2
APPLICATION NO. : 10/839922
DATED : September 29, 2009
INVENTOR(S) : Duerk et al.

It is certified that error appears in the above-identified patent and that said Letters Patent is hereby corrected as shown below:

In column 3, line 5, delete "simultanously" and insert --simultaneously--.

In column 8, line 37, delete "simulation" and insert --simulations--.

In column 8, line 38, delete "use din" and insert --used in--.

In column 8, line 39, delete "make" and insert --makes--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,596,402 B2  Page 1 of 1
APPLICATION NO. : 10/839922
DATED : September 29, 2009
INVENTOR(S) : Duerk et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1043 days.

Signed and Sealed this

Twenty-eighth Day of September, 2010

David J. Kappos
*Director of the United States Patent and Trademark Office*